United States Patent
Lin et al.

(10) Patent No.: US 12,494,458 B2
(45) Date of Patent: Dec. 9, 2025

(54) LIGHT EMITTING DISPLAY UNIT AND DISPLAY APPARATUS

(71) Applicant: PlayNitride Display Co., Ltd., MiaoLi County (TW)

(72) Inventors: Wei-Ping Lin, MiaoLi County (TW); Po-Jen Su, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 577 days.

(21) Appl. No.: 17/944,199

(22) Filed: Sep. 14, 2022

(65) Prior Publication Data
US 2024/0072012 A1    Feb. 29, 2024

(30) Foreign Application Priority Data

Aug. 29, 2022  (TW) .................................. 111132409

(51) Int. Cl.
*H01L 25/075*   (2006.01)
*H01L 25/16*    (2023.01)
*H10H 20/857*   (2025.01)

(52) U.S. Cl.
CPC ........ *H01L 25/0753* (2013.01); *H01L 25/167* (2013.01); *H10H 20/857* (2025.01)

(58) Field of Classification Search
CPC .. H10H 29/142; H10H 20/831; H10H 20/857; H10H 29/10; H10H 20/83; H01L 25/0753; H01L 25/167
See application file for complete search history.

(56) References Cited

U.S. PATENT DOCUMENTS

| 2019/0229097 | A1* | 7/2019 | Takeya | H01L 21/6835 |
| 2021/0408488 | A1* | 12/2021 | Lu | H10K 71/00 |
| 2022/0199592 | A1* | 6/2022 | Xin | H10H 20/857 |

FOREIGN PATENT DOCUMENTS

| CN | 110491896 A | * | 11/2019 | ........... H01L 23/552 |
| CN | 112530926 | | 3/2021 | |
| CN | 112599510 | | 4/2021 | |
| CN | 112713142 A | * | 4/2021 | ............... G09F 9/33 |

(Continued)

OTHER PUBLICATIONS

Yang Xiangning; Wu Zhiling; Su Yimin; Wu Baiwei, English Translation of CN110491896A (Year: 2019).*

(Continued)

*Primary Examiner* — Kretelia Graham
*Assistant Examiner* — Hamna Fathima Iqbal
(74) *Attorney, Agent, or Firm* — JCIPRNET

(57) ABSTRACT

A light emitting display unit includes a redistribution layer (RDL) and multiple light emitting elements. The RDL includes multiple electrode patterns, multiple pad patterns, an insulating layer and multiple conductive through holes. A first gap and a second gap are respectively formed between two adjacent electrode patterns and between corresponding two adjacent pad patterns. A third length of the overlapping area of an orthographic projection of the first gap on the pad patterns and the pad patterns in a first direction is less than or equal to a second length of the second gap in the first direction. The micro light emitting elements are disposed on the RDL and electrically connected with the electrode patterns.

10 Claims, 4 Drawing Sheets

100a

(56) References Cited

FOREIGN PATENT DOCUMENTS

| | | |
|---|---|---|
| CN | 113410183 | 9/2021 |
| TW | 202141779 | 11/2021 |

OTHER PUBLICATIONS

Su Bairen; Lin Weiping, English Translation of CN112713142A (Year: 2021).*
"Office Action of Taiwan Counterpart Application", issued on Sep. 3, 2024, p. 1-p. 3.
"Office Action of Taiwan Counterpart Application", issued on Aug. 4, 2023, p. 1-p. 6.
"Office Action of China Counterpart Application", issued on Jun. 21, 2025, p. 1-p. 9.

* cited by examiner

LIGHT EMITTING DISPLAY UNIT AND DISPLAY APPARATUS

CROSS-REFERENCE TO RELATED APPLICATION

This application claims the priority benefit of Taiwan application serial no. 111132409, filed on Aug. 29, 2022. The entirety of the above-mentioned patent application is hereby incorporated by reference herein and made a part of this specification.

BACKGROUND

Technical Field

The disclosure relates to a self-luminous display technology, and in particular relates to a light emitting display unit and a display apparatus.

Description of Related Art

After the micro light emitting diode display unit is transferred from the epitaxial substrate to the film layer (such as blue film), in the process of picking up parts with an ejector pin (such as sorting and bonding), the micro light emitting diode display unit without the protection of a transparent hard substrate (such as a glass substrate or a sapphire substrate) will bend on the film layer. In addition, there is no metal layer but only an insulating layer disposed in some regions of the micro light emitting diode display unit, resulting in insufficient support strength of the micro light emitting diode display unit and causing splits, thereby affecting the overall structural reliability and yield.

SUMMARY

The disclosure provides a light emitting display unit, which may avoid splitting, improve yield, and have better structural reliability.

The disclosure also provides a display apparatus including the light emitting display unit, which may have better display yield.

The light emitting display unit of the disclosure includes a redistribution layer and multiple micro light emitting elements. The redistribution layer includes multiple electrode patterns, multiple pad patterns, an insulating layer, and multiple conductive through holes. The insulating layer is disposed between the electrode patterns and the pad patterns. The conductive through holes are disposed in the insulating layer and electrically connect the electrode patterns and the corresponding pad patterns. The electrode patterns are electrically independent from each other. A first gap and a second gap are respectively formed between two adjacent electrode patterns and between corresponding two adjacent pad patterns. The first gap and the second gap respectively have a first length and a second length in a first direction. A third length of an overlapping area of an orthographic projection of the first gap on the pad patterns and the pad patterns in a first direction is less than or equal to the second length of the second gap in the first direction. The micro light emitting elements are disposed on the redistribution layer and electrically connected with the electrode patterns.

The light emitting display unit of the disclosure includes a redistribution layer and multiple micro light emitting elements. The redistribution layer includes multiple electrode patterns, multiple pad patterns, an insulating layer, and multiple conductive through holes. The insulating layer is disposed between the electrode patterns and the pad patterns. The conductive through holes are disposed in the insulating layer and electrically connect the electrode patterns and the corresponding pad patterns. The micro light emitting elements are disposed on the redistribution layer and electrically connected with the electrode patterns. A portion of the insulating layer is exposed between the micro light emitting elements. The light emitting display unit has a first length in a first direction, and a second length of the insulating layer exposed between the micro light emitting elements in the first direction is less than 50% of the first length. In the first direction, the insulating layer overlaps with at least one of the electrode patterns and the pad patterns from a center line to an edge of the light emitting display unit.

The display apparatus of the disclosure includes a driving substrate and multiple light emitting display units. The driving substrate includes multiple pads. The light emitting display units are respectively electrically connected to the driving substrate through the pads, and each of the light emitting display units includes a redistribution layer and multiple micro light emitting elements. The redistribution layer includes multiple electrode patterns, multiple pad patterns, an insulating layer, and multiple conductive through holes. The insulating layer is disposed between the electrode patterns and the pad patterns. The conductive through holes are disposed in the insulating layer and electrically connect the electrode patterns and the corresponding pad patterns. The electrode patterns are electrically independent from each other. A first gap and a second gap are respectively formed between two adjacent electrode patterns and between corresponding two adjacent pad patterns. The first gap and the second gap respectively have a first length and a second length in a first direction. A third length of an overlapping area of an orthographic projection of the first gap on the pad patterns and the pad patterns in a first direction is less than or equal to the second length of the second gap in the first direction. The micro light emitting elements are disposed on the redistribution layer and electrically connected with the electrode patterns.

Based on the above, in the design of the light emitting display unit of the disclosure, a first gap and a second gap are respectively formed between two adjacent electrode patterns and between two corresponding adjacent pad patterns. The first gap and the second gap respectively have a first length and a second length in the first direction. A third length of an overlapping area of an orthographic projection of the first gap on the pad patterns and the pad patterns in a first direction is less than or equal to the second length of the second gap in the first direction. With this design, the gap between the electrode pattern and the pad pattern may be staggered, and splitting may be effectively avoided, so as to improve the yield, so that the light emitting display unit of the disclosure may have better structural reliability. In addition, the display apparatus including the light emitting display unit of the disclosure may have better display yield.

In order to make the above-mentioned features and advantages of the disclosure comprehensible, embodiments accompanied with drawings are described in detail below.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1A:
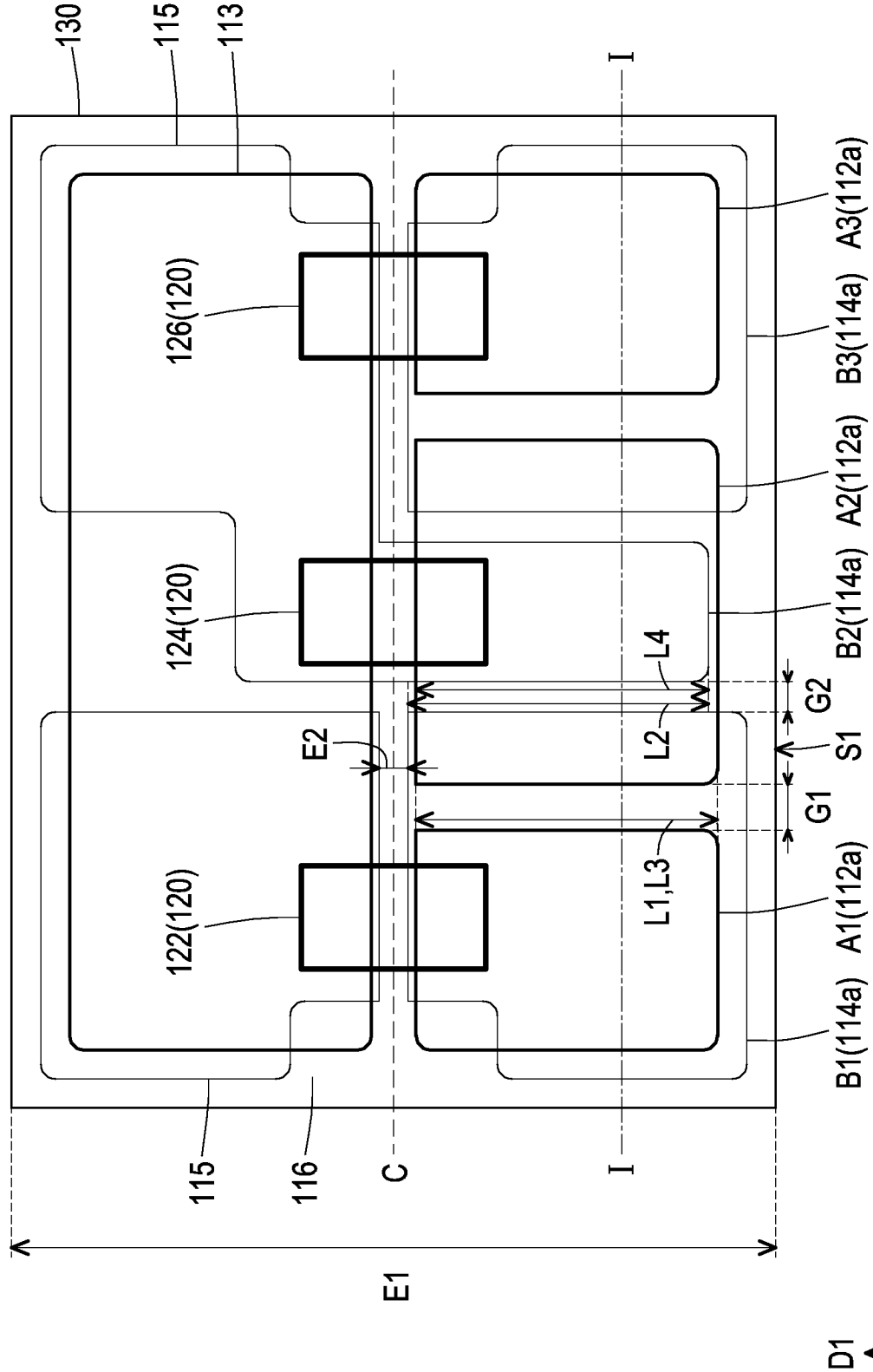
FIG. 1A is a top perspective schematic view of a light emitting display unit according to an embodiment of the disclosure.
Figure 1B:
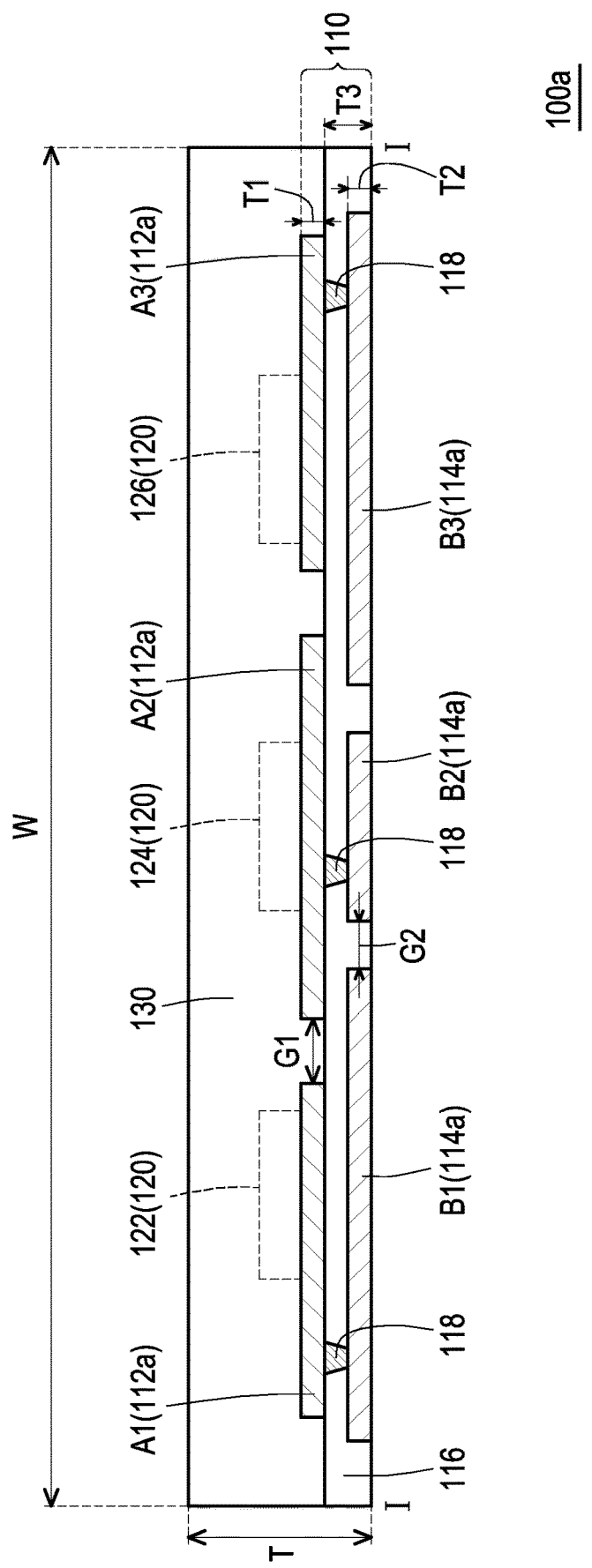
FIG. 1B is a cross-sectional schematic view along a line I-I of FIG. 1A.

FIG. 1A is a top perspective schematic view of a light emitting display unit according to an embodiment of the disclosure. FIG. 1B is a cross-sectional schematic view along a line I-I of FIG. 1A. For the sake of clarity, the conductive through holes of the redistribution layer are omitted in FIG. 1A.

Referring to FIG. 1A and FIG. 1B at the same time, in this embodiment, a light emitting display unit 100a includes a redistribution layer 110 and multiple micro light emitting elements 120. The redistribution layer 110 includes multiple electrode patterns 112a, multiple pad patterns 114a, an insulating layer 116, and multiple conductive through holes 118. The insulating layer 116 is disposed between the electrode patterns 112a and the pad patterns 114a. The conductive through holes 118 are disposed in the insulating layer 116 and electrically connect the electrode patterns 112a and the corresponding pad patterns 114a. The electrode patterns 112a are electrically independent from each other. A first gap G1 and a second gap G2 are respectively formed between two adjacent electrode patterns 112a and between corresponding two adjacent pad patterns 114a. The first gap G1 and the second gap G2 respectively have a first length L1 and a second length L2 in a first direction D1. A third length L3 of the overlapping area of an orthographic projection of the first gap G1 on the pad patterns 114a and the pad patterns 114a in a first direction D1 is less than or equal to the second length L2 of the second gap G2 in the first direction D1. A fourth length L4 of the overlapping area of an orthographic projection of the second gap G2 on the electrode patterns 112a and the electrode patterns 112a in the first direction D1 is less than or equal to the first length L1 of the first gap G1 in the first direction D1. The micro light emitting elements 120 are disposed on the redistribution layer 110 and electrically connected with the electrode patterns 112a.

In detail, in this embodiment, the electrode patterns 112a of the redistribution layer 110 may be located above the pad patterns 114a. In one embodiment, the electrode patterns 112a are disposed on the top surface of the insulating layer 116, and one side of the pad patterns 114a may be cut to be flush with the bottom surface of the insulating layer 116, that is, the pad patterns 114a are buried in the insulating layer 116. When a solder mask layer (not shown) is subsequently disposed on the bottom surface of the insulating layer 116, a relatively flat surface may be formed, but not limited thereto. The electrode patterns 112a may be electrically connected to the corresponding pad patterns 114a through conductive through holes 118 extending from the top surface of the insulating layer 116 to the pad patterns 114a. That is, the upper layer of the redistribution layer 110 is the electrode pattern 112a, and the lower layer is the pad pattern 114a. The material of the electrode patterns 112a and the material of the pad patterns 114a may be, for example, copper, respectively, and the material of the insulating layer 116 may be, for example, an organic insulating material or an inorganic insulating material, but not limited thereto. The number of these micro light emitting elements 120 is, for example, three, and they are arranged on the redistribution layer 110 at intervals along a second direction D2 perpendicular to the first direction D1. In one embodiment, the micro light emitting elements 120 may include a red micro light emitting element 122, a green micro light emitting element 124, and a blue micro light emitting element 126, but not limited thereto. One end of each of the micro light emitting elements 120 is respectively electrically connected to the electrode patterns 112a, and the other end of each of the micro light emitting elements 120 is electrically connected to an electrode pattern 113. That is, the light emitting display unit 100a may be designed with a common cathode. The electrode pattern 113 is also electrically connected to two pad patterns 115 below through the conductive through holes 118.

Referring to FIG. 1A and FIG. 1B at the same time again, a portion of the insulating layer 116 is exposed between the micro light emitting elements 120. In detail, the light emitting display unit 100a has a first length E1 in the first direction D1, and a second length E2 of the insulating layer 116 exposed between the micro light emitting elements 120 in the first direction D1 is smaller than 50% of the first length E1. In a top view, in the first direction D1, the insulating layer 116 overlaps with at least one of the electrode pattern 112a and the pad pattern 114a from a center line C to an edge S1 of the light emitting display unit 100a. That is, the insulating layer 116 is not continuously exposed from the center line C to the edge S1. More specifically, the insulating layer 116 exposed between the micro light emitting elements 120 does not exhibit continuous exposure.

Furthermore, the light emitting display unit 100a of the present embodiment further includes an encapsulant 130, in which the 130 is disposed on the redistribution layer 110 and covers the micro light emitting element 120. Here, the material of the encapsulant 130 is, for example, organic polymer, acrylic, or resin. The ratio of the thickness T of the light emitting display unit 100a (including the thickness T3 of the insulating layer 116 plus the thickness of the encapsulant 130) to the width W (here, the width of the insulating layer 116 in the second direction D2) is between 0.3 and 1. The width W described here refers to the maximum width. In one embodiment, the width W may be, for example, 270 µm to 330 µm, but not limited thereto. In one embodiment, the thickness T is, for example, 100 microns, and the width W is, for example, 300 microns, but not limited thereto. In a cross-sectional view, the electrode patterns 112a have a first thickness T1, the pad patterns 114a have a second thickness T2, and the insulating layer 116 has a third thickness T3. The first thickness T1 and the second thickness T2 are respectively smaller than the third thickness T3. Preferably, the ratio of the first thickness T1 or the second thickness T2 to the third thickness T3 is greater than 0.3 and less than or equal to 0.5. In one embodiment, the first thickness T1, the second thickness T2, and the third thickness T3 may all be, for example, less than 10 µm, respectively. In one embodiment, the first thickness T1 may be, for example, 4 microns, the second thickness T2 may be, for example, 3 microns, and the third thickness T3 may be, for example, 9 microns. Because the light emitting display unit 100a is too wide and thin, the long and thin light emitting display unit 100a is easily bent and broken during the ejector pin manufacturing process. In addition, the micro light emitting elements are arranged on the redistribution layer 110 at intervals along the first direction D2, so that the insulating layer exposed in the middle is easily split because the redistribution layer 110 cannot support the micro light emitting elements 120. Therefore, the yield is improved by strengthening the structural strength of the redistribution layer 110.

In addition, referring to FIG. 1A and FIG. 1B at the same time again, in this embodiment, the electrode patterns 112a include a first electrode pattern A1, a second electrode pattern A2, and a third electrode pattern A3 which are separated from each other. The pad patterns 114a include a first pad pattern B1, a second pad pattern B2, and a third pad pattern B3 which are separated from each other. The orthographic projection of the second electrode pattern A2 on the pad patterns 114a overlaps the first pad pattern B1, the second pad pattern B2, and the third pad pattern B3. That is to say, the orthographic projection of the second electrode pattern A2 on the pad pattern 114a extends from the second pad pattern B2 to both sides and overlaps the first pad pattern B1 and the third pad pattern B3, which may cover the second gap G2 between the first pad pattern B1 and the second pad pattern B2 and between the second pad pattern B2 and the third pad pattern B3. Preferably, the ratio of the overlapping area of the orthographic projection of the second electrode pattern A2 on the pad patterns 114a and the first pad pattern B1 or the third pad pattern B3 to the area of the first pad pattern B1 or the third pad pattern B3 is less than 0.1. That is to say, the ratio of the overlapping area of the orthographic projection of the second electrode pattern A2 on the pad pattern 114a and the first pad pattern B1 to the area of the first pad pattern B1 is less than 0.1, and the ratio of the overlapping area of the orthographic projection of the second electrode pattern A2 on the pad pattern 114a and the third pad pattern B3 to the area of the third pad pattern B3 is less than 0.1. On the other hand, the orthographic projections of the first gap G1 between the first electrode pattern A1 and the second electrode pattern A2 and between the second electrode pattern A2 and the third electrode pattern A3 on the pad pattern 114a are also respectively covered by the first pad pattern B1 and the third pad pattern B2.

In short, the electrode patterns 112a and the pad patterns 114a of the redistribution layer 110 of the present embodiment are disposed to overlap, in which the first gap G1 of the upper electrode pattern 112a and the second gap G2 of the lower pad pattern 114a are staggered. That is, the orthographic projections do not overlap, and the orthographic projection of the first gap G1 overlaps the pad pattern 114a (i.e., the first pad pattern B1 and the third pad pattern B3), and the orthographic projection of the second gap G2 overlaps the electrode pattern 112a (i.e., the second electrode pattern A2), that is, the orthographic projection of the gap may overlap the electrode pattern 112a or the pad pattern 114a. In this way, the structural strength of the redistribution layer 110 may be strengthened to improve the yield, so as to improve and avoid the problem of splitting caused by the process of picking up parts with an ejector pin in prior arts. There is no need to dispose a transparent hard material for protection, which may effectively reduce the process and manufacturing costs. Therefore, the light emitting display unit 100a of this embodiment may have better structural reliability.

It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 2:
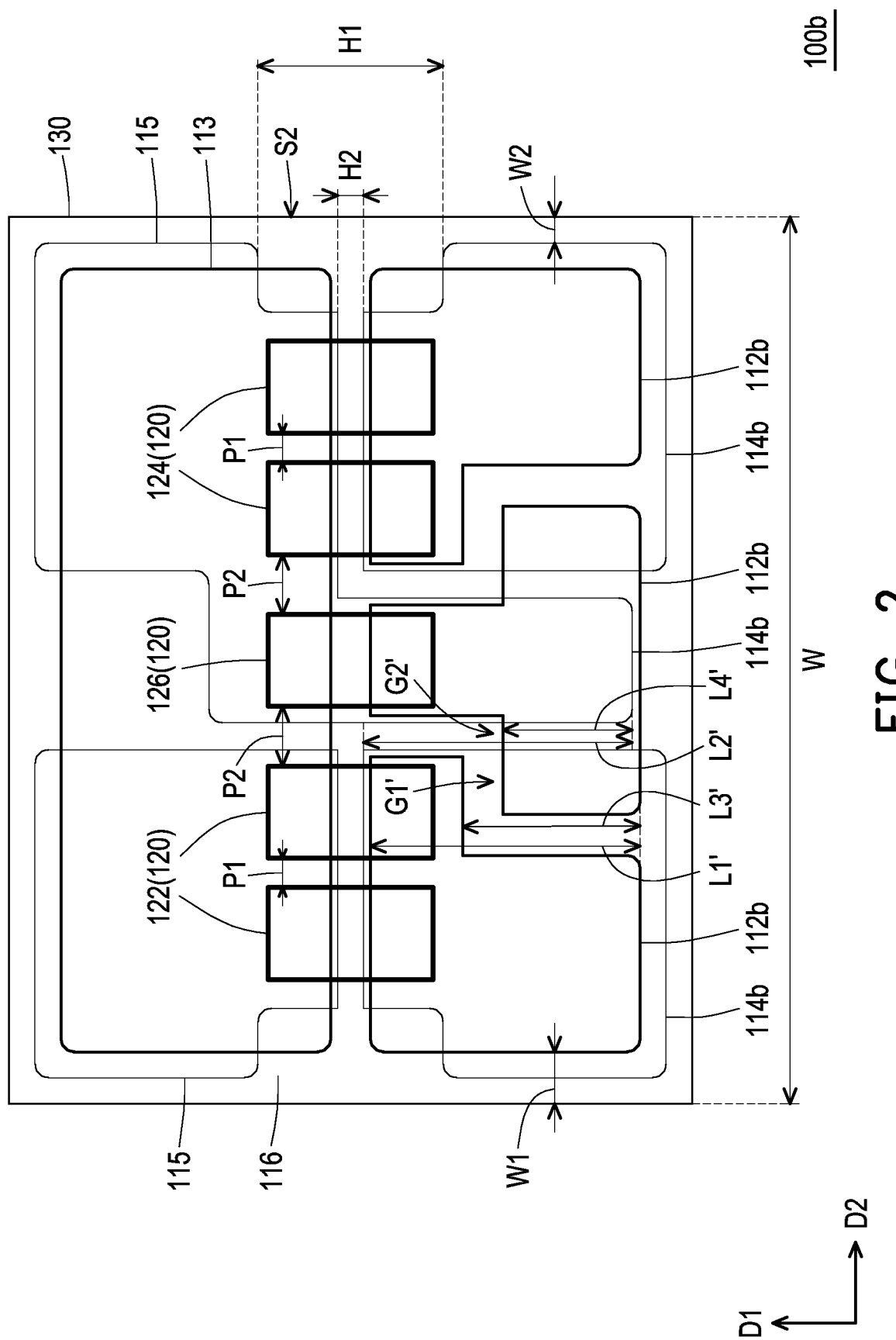
FIG. 2 is a top perspective schematic view of a light emitting display unit according to another embodiment of the disclosure.

FIG. 2 is a top perspective schematic view of a light emitting display unit according to another embodiment of the disclosure. For the sake of clarity, the conductive through holes of the redistribution layer are also omitted in FIG. 2. Referring to FIG. 1A and FIG. 2 at the same time, the light emitting display unit 100b of this embodiment is similar to the light emitting display unit 100a of FIG. 1A, with the difference between the two being: in this embodiment, due to different electrical requirements, the top-view shape of the electrode patterns 112b are different from the top-view shape of the electrode patterns 112a in FIG. 1A. Also because the design of the electrode patterns 112b are different from that of the electrode patterns 112a, the top-view shape (e.g., a Z shape) of the first gap G1' in this embodiment is different from the top-view shape (e.g., a straight line) of the first gap G1. A third length L3' of the overlapping area of an orthographic projection of the first gap G1' on the pad patterns 114b and the pad patterns 114b in the first direction D1 is less than the second length L2' of the second gap G2' in the first direction D1. A fourth length L4' of the overlapping area of an orthographic projection of the second gap G2' on the pad patterns 112b and the pad patterns 112b in the first direction D1 is less than the first length L1' of the first gap G1' in the first direction D1. In one embodiment, the third length L3' may be less than 80% of the second length L2', preferably less than 50%, and the fourth length L4' may be less than 80% of the first length L1', preferably less than 50%.

Furthermore, in this embodiment, the micro light emitting elements 120 include multiple first color micro light emitting elements 122 (or 124) and a second color micro light emitting element 126. There is a first pitch P1 between two adjacent first color micro light emitting elements 122 (or 124), there is a second pitch P2 between the second color micro light emitting element 126 and the adjacent first color micro light emitting elements 122 (or 124), and the second pitch P2 is greater than the first pitch P1. That is to say, the pitch between the micro light emitting elements 120 of the same color light (i.e., the first pitch P1) is smaller than the pitch between the micro light emitting elements 120 of different color light (i.e., the second pitch P2). The pitch described here refers to the minimum pitch. In one embodiment, the first color micro light emitting element 122 may be, for example, a red micro light emitting element, or, the first color micro light emitting element 124 may be, for example, a green micro light emitting element, and the second color micro light emitting element 126 may be, for example, a blue micro light emitting element. Here, the micro light emitting elements 120 include two red micro light emitting elements 122, one blue micro light emitting element 126, and two green micro light emitting elements 124. The blue micro light emitting element 126 is located between the red micro light emitting elements 122 and the green micro light emitting elements 124, and a symmetrical configuration may reduce the design complexity of the corresponding electrode pattern 112b.

In addition, referring to FIG. 2 again, in this embodiment, the insulating layer 116 has a width W in the second direction D2 perpendicular to the first direction D1, the electrode patterns 112b are shrunk by a first distance W1 relative to the insulating layer 116 in the second direction D2, and the pad patterns 114b are shrunk by a second distance W2 relative to the insulating layer 116 in the second direction D2. Preferably, the ratio of the first distance W1 to the width W and the ratio of the second distance W2 to the width W may be, for example, between 0.05 and 0.15, respectively. If the ratio above is too small, it will be unfavorable for the bonding yield of the micro light emitting element 120 and the electrode pattern 112*b*, as well as the pad pattern 114*b*2 and the subsequent driving substrate; on the other hand, if the ratio above is too large, then during subsequent bonding with the driving substrate, if the sidewall of the pad pattern 114*b* is exposed (i.e., not covered by the insulating layer 116) due to the cutting tolerance, the solder bump will be squeezed onto the electrode pattern 112*b* due to thermocompression, resulting in short circuit. In one embodiment, the first distance W1 and the second distance W2 may be, for example, 20 microns to 30 microns, respectively. In one embodiment, the first distance W1 and the second distance W2 may be different. For example, the first distance W1 may be greater than the second distance W2, so as to avoid the short circuiting due to cutting tolerances during subsequent mounting process.

In addition, referring to FIG. 2 again, the two adjacent pad patterns 114*b* and 115 arranged in the first direction D1 have a first distance H1 and a second distance H2. The first distance H1 is adjacent to the edge S2 of the insulating layer 116 relative to the second distance H2, and the first distance H1 is greater than the second distance H2. With this design, a portion of space may be reserved to prevent and retain the solder bumps that are subsequently squeezed onto the insulating layer 116 due to thermocompression bonding, which may effectively improve the structural reliability of the light emitting display unit 100*b*.

Figure 3:
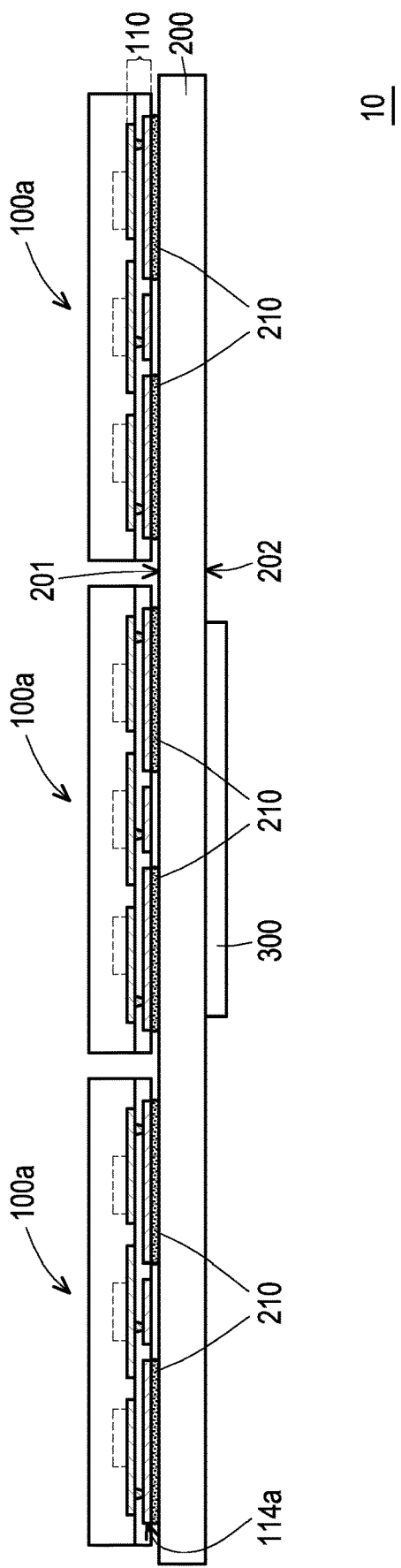
FIG. 3 is a schematic view of a display apparatus according to an embodiment of the disclosure.

FIG. 3 is a schematic view of a display apparatus according to an embodiment of the disclosure. Referring to FIG. 3, in this embodiment, a display apparatus 10 includes a driving substrate 200 and multiple light emitting display units 100*a* as shown in FIG. 1B. The light emitting display units 100*a* are electrically connected to an upper surface 201 of the driving substrate 200. Specifically, the driving substrate 200 includes multiple pads 210 separated from each other, and the pad pattern 114*a* of the redistribution layer 110 of each of the light emitting display unit 100*a* is electrically connected to the driving substrate 200 through the pads 210. Each of the pixels in the pixel area of the display apparatus 10 is formed by a light emitting display unit 100*a*. In addition, the display apparatus 10 of this embodiment further includes a driving circuit element 300, which is disposed on a lower surface 202 of the driving substrate 200 relatively far from the light emitting display unit 100*a* and is electrically connected to the driving substrate 200 to control the light emitting display units to form a display screen.

It is worth mentioning that in other not-shown embodiments, the light emitting display unit may include at least any one of the light emitting display units 100*a* and 100*b* according to requirements, which is not limited in the disclosure. That is to say, the number of the light emitting display units may be one or more, which may be the same structure or different structures, and may be selected according to requirements. In addition, the driving substrate 200 of this embodiment may be, for example, a complementary metal-oxide-semiconductor (CMOS) substrate, a liquid crystal on silicon (LCOS) substrate, a thin film transistor (TFT) substrate, a printed circuit board (PCB), or other substrates with working circuits, which are not limited thereto.

To sum up, in the design of the light emitting display unit of the disclosure, a first gap and a second gap are respectively formed between two adjacent electrode patterns and between two corresponding adjacent pad patterns. The first gap and the second gap respectively have a first length and a second length in the first direction. A third length of the overlapping area of an orthographic projection of the first gap on the pad patterns and the pad patterns in a first direction is less than or equal to a second length of the second gap in the first direction. With this design, the gap between the electrode patterns and the pad patterns may be staggered, and splitting may be effectively avoided, so as to improve the yield, so that the light emitting display unit of the disclosure may have better structural reliability. In addition, the display apparatus including the light emitting display unit of the disclosure may have better display yield.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A light emitting display unit, comprising:
   a redistribution layer, comprising a plurality of electrode patterns, a plurality of pad patterns, an insulating layer, and a plurality of conductive through hole, wherein the insulating layer is disposed between the electrode patterns and the pad patterns, the conductive through holes are disposed in the insulating layer and electrically connect the electrode patterns and the corresponding pad patterns, the electrode patterns are electrically independent from each other, wherein a first gap and a second gap are respectively formed between two adjacent electrode patterns of the electrode patterns and between corresponding two adjacent pad patterns of the pad patterns, the first gap and the second gap respectively have a first length and a second length in a first direction, a third length of an overlapping area of an orthographic projection of the first gap on the pad patterns and the pad patterns in a first direction is less than or equal to the second length of the second gap in the first direction; and
   a plurality of micro light emitting elements, disposed on the redistribution layer and electrically connected with the electrode patterns,
   wherein the electrode patterns comprise a first electrode pattern, a second electrode pattern, and a third electrode pattern which are separated from each other, the pad patterns comprise a first pad pattern, a second pad pattern, and a third pad pattern which are separated from each other, an orthographic projection of the second electrode pattern on the pad patterns overlaps the first pad pattern, the second pad pattern, and the third pad pattern,
   wherein a ratio of an overlapping area of the orthographic projection of the second electrode pattern on the pad patterns and the first pad pattern or the third pad pattern to an area of the first pad pattern or the third pad pattern is less than 0.1.

2. The light emitting display unit according to claim 1, wherein a fourth length of an overlapping area of an orthographic projection of the second gap on the electrode patterns and the electrode patterns in the first direction is less than or equal to the first length of the first gap in the first direction.

3. The light emitting display unit according to claim 1, wherein the insulating layer has a width in a second direction perpendicular to the first direction, the electrode patterns are shrunk by a first distance relative to the insulating layer in the second direction, and the pad patterns are shrunk by a second distance relative to the insulating layer in the second direction.

4. The light emitting display unit according to claim 3, wherein a ratio of the first distance to the width and a ratio of the second distance to the width are respectively between 0.05 and 0.15.

5. The light emitting display unit according to claim 3, wherein the first distance is greater than the second distance.

6. The light emitting display unit according to claim 1, wherein the two adjacent pad patterns of the pad patterns arranged in the first direction have a first distance and a second distance, the first distance is adjacent to an edge of the insulating layer relative to the second distance, and the first distance is greater than the second distance.

7. The light emitting display unit according to claim 1, wherein a ratio of a thickness to a width of the light emitting display unit is between 0.3 and 1.

8. The light emitting display unit according to claim 1, wherein in a cross-sectional view, the electrode patterns have a first thickness, the pad patterns have a second thickness, and the insulating layer has a third thickness, the first thickness and the second thickness are respectively smaller than the third thickness.

9. A light emitting display unit, comprising:
a redistribution layer, comprising a plurality of electrode patterns, a plurality of pad patterns, an insulating layer, and a plurality of conductive through hole, wherein the insulating layer is disposed between the electrode patterns and the pad patterns, the conductive through holes are disposed in the insulating layer and electrically connect the electrode patterns and the corresponding pad patterns; and
a plurality of micro light emitting elements, disposed on the redistribution layer and electrically connected with the electrode patterns, wherein a portion of the insulating layer is exposed between the micro light emitting elements, the light emitting display unit has a first length in a first direction, and a second length of the insulating layer exposed between the micro light emitting elements in the first direction is less than 50% of the first length, and in the first direction, the insulating layer overlaps with at least one of the electrode patterns and the pad patterns from a center line to an edge of the light emitting display unit,
wherein the electrode patterns comprise a first electrode pattern, a second electrode pattern, and a third electrode pattern which are separated from each other, the pad patterns comprise a first pad pattern, a second pad pattern, and a third pad pattern which are separated from each other, an orthographic projection of the second electrode pattern on the pad patterns overlaps the first pad pattern, the second pad pattern, and the third pad pattern,
wherein a ratio of an overlapping area of the orthographic projection of the second electrode pattern on the pad patterns and the first pad pattern or the third pad pattern to an area of the first pad pattern or the third pad pattern is less than 0.1.

10. A display apparatus, comprising:
a driving substrate, comprising a plurality of pads; and
a plurality of light emitting display units, respectively electrically connected to the driving substrate through the pads, each of the light emitting display units comprising:
a redistribution layer, comprising a plurality of electrode patterns, a plurality of pad patterns, an insulating layer, and a plurality of conductive through hole, wherein the insulating layer is disposed between the electrode patterns and the pad patterns, the conductive through holes are disposed in the insulating layer and electrically connect the electrode patterns and the corresponding pad patterns, the electrode patterns are electrically independent from each other, wherein a first gap is formed between two adjacent electrode patterns of the electrode patterns, a second gap is formed between two adjacent pad patterns of the pad patterns corresponding to the two adjacent electrode patterns, the first gap and the second gap respectively have a first length and a second length in a first direction, a third length of an overlapping area of an orthographic projection of the first gap on the pad patterns and the pad patterns in a first direction is less than or equal to the second length of the second gap in the first direction; and
a plurality of micro light emitting elements, disposed on the redistribution layer and electrically connected with the electrode patterns,
wherein the electrode patterns comprise a first electrode pattern, a second electrode pattern, and a third electrode pattern which are separated from each other, the pad patterns comprise a first pad pattern, a second pad pattern, and a third pad pattern which are separated from each other, an orthographic projection of the second electrode pattern on the pad patterns overlaps the first pad pattern, the second pad pattern, and the third pad pattern,
wherein a ratio of an overlapping area of the orthographic projection of the second electrode pattern on the pad patterns and the first pad pattern or the third pad pattern to an area of the first pad pattern or the third pad pattern is less than 0.1.

* * * * *